US012572416B2

(12) United States Patent
Chachad et al.

(10) Patent No.: US 12,572,416 B2
(45) **Date of Patent: \*Mar. 10, 2026**

(54) ERROR CORRECTING CODES FOR MULTI-MASTER MEMORY CONTROLLER

(71) Applicant: TEXAS INSTRUMENTS INCORPORATED, Dallas, TX (US)

(72) Inventors: Abhijeet Ashok Chachad, Plano, TX (US); David Matthew Thompson, Dallas, TX (US); Son Hung Tran, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/453,598

(22) Filed: Aug. 22, 2023

(65) Prior Publication Data

US 2023/0393933 A1     Dec. 7, 2023

Related U.S. Application Data

(63) Continuation of application No. 17/670,582, filed on Feb. 14, 2022, now Pat. No. 11,768,733, which is a
(Continued)

(51) Int. Cl.
*H03M 13/27* (2006.01)
*G06F 9/30* (2018.01)
(Continued)

(52) U.S. Cl.
CPC ........ *G06F 11/106* (2013.01); *G06F 9/30047* (2013.01); *G06F 9/30101* (2013.01);
(Continued)

(58) Field of Classification Search
CPC .. G06F 11/106; G06F 9/4498; G06F 9/30047; G06F 9/30101; G06F 9/3867;
(Continued)

(56) References Cited

U.S. PATENT DOCUMENTS

| 6,038,693 A | 3/2000 | Zhang |
| 6,460,157 B1 | 10/2002 | Chen |

(Continued)

FOREIGN PATENT DOCUMENTS

| CN | 101807165 B | 7/2012 |
| CN | 102253865 B | 3/2014 |

(Continued)

OTHER PUBLICATIONS

International Search Report for PCT/US2020/034459, mailed Aug. 13, 2020.

(Continued)

*Primary Examiner* — Justin R Knapp
(74) *Attorney, Agent, or Firm* — Michael T. Gabrik; Frank D. Cimino

(57) ABSTRACT

A system includes a memory controller, multiple memories coupled to the memory controller, and multiple controlling components coupled to the memory controller. The memory controller calculates an error correction code (ECC) syndrome of a first type for a segment of data; stores the segment of data and the ECC syndrome of the first type in a first memory of the multiple memories; receives a request from a controlling component of the multiple controlling components directed to the segment of data, the controlling component implementing an ECC syndrome of a second type; transforms the ECC syndrome of the first type for the segment of data to the ECC syndrome of the second type; detects a number of errors, if any, present in the segment of data; and takes further action depending on how many errors are detected.

18 Claims, 6 Drawing Sheets

1000

1002 — RECEIVING, BY A CONTROLLER COUPLED TO A FIRST MEMORY AND TO A SECOND MEMORY, A TRANSACTION FROM A MASTER, WHEREIN THE TRANSACTION IS DIRECTED TO THE FIRST MEMORY AND COMPRISES AN ADDRESS

1004 — RE-CALCULATING, BY THE CONTROLLER, AN ERROR CORRECTING CODE (ECC) FOR A LINE OF DATA IN THE SECOND MEMORY ASSOCIATED WITH THE ADDRESS

1006 — DETERMINING, BY THE CONTROLLER, THAT A NON-CORRECTABLE ERROR IS PRESENT IN THE LINE OF DATA IN THE SECOND MEMORY BASED ON A COMPARISON OF THE RE-CALCULATED ECC AND A STORED ECC FOR THE LINE OF DATA

1008 — IN RESPONSE TO DETERMINING THAT A NON-CORRECTABLE ERROR IS PRESENT IN THE LINE OF DATA IN THE SECOND MEMORY, TERMINATING THE TRANSACTION EARLY WITHOUT ACCESSING THE FIRST MEMORY

Related U.S. Application Data continuation of application No. 16/882,372, filed on May 22, 2020, now Pat. No. 11,249,842.

(60) Provisional application No. 62/852,465, filed on May 24, 2019.

(51) Int. Cl.

| | |
|---|---|
| *G06F 9/38* | (2018.01) |
| *G06F 9/448* | (2018.01) |
| *G06F 9/46* | (2006.01) |
| *G06F 9/48* | (2006.01) |
| *G06F 9/52* | (2006.01) |
| *G06F 11/10* | (2006.01) |
| *G06F 12/0811* | (2016.01) |
| *G06F 12/0815* | (2016.01) |
| *G06F 12/0879* | (2016.01) |
| *G06F 12/0888* | (2016.01) |
| *G06F 12/0895* | (2016.01) |
| *G06F 12/128* | (2016.01) |
| *G06F 13/16* | (2006.01) |
| *G06N 3/045* | (2023.01) |
| *H03M 13/15* | (2006.01) |
| *H03M 13/25* | (2006.01) |
| *H04L 1/00* | (2006.01) |
| *H04L 27/34* | (2006.01) |

(52) U.S. Cl.
CPC .......... *G06F 9/3867* (2013.01); *G06F 9/4498* (2018.02); *G06F 9/467* (2013.01); *G06F 9/4812* (2013.01); *G06F 9/52* (2013.01); *G06F 11/1064* (2013.01); *G06F 11/1068* (2013.01); *G06F 12/0811* (2013.01); *G06F 12/0879* (2013.01); *G06F 12/0895* (2013.01); *G06F 13/1668* (2013.01); *H03M 13/1575* (2013.01); *G06F 12/0815* (2013.01); *G06F 12/0888* (2013.01); *G06F 12/128* (2013.01); *G06F 2212/1024* (2013.01); *G06F 2212/1028* (2013.01); *G06F 2212/1032* (2013.01); *G06F 2212/608* (2013.01)

(58) Field of Classification Search
CPC .......... G06F 9/467; G06F 9/4812; G06F 9/52; G06F 11/064; G06F 11/1068; G06F 12/0811; G06F 12/0879; G06F 12/0895; G06F 13/1668; G06F 12/0815; G06F 12/0888; G06F 12/128; G06F 2212/1024; G06F 2212/1028; G06F 2212/1032; G06F 2212/608; G06F 13/668; H03M 13/1575
See application file for complete search history.

(56) References Cited

U.S. PATENT DOCUMENTS

| | | | | |
|---|---|---|---|---|
| 8,677,205 | B2 * | 3/2014 | Ramaraju | G06F 11/1064 |
| | | | | 714/755 |
| 9,929,750 | B2 | 3/2018 | Kaku | |
| 10,007,456 | B1 | 6/2018 | Chinnakkonda Vidyapoornachary | |
| 10,268,539 | B2 * | 4/2019 | Wu | H03M 13/15 |
| 10,482,990 | B2 | 11/2019 | Hoya | |
| 11,249,842 | B2 * | 2/2022 | Chachad | G06F 13/1668 |
| 11,416,334 | B2 | 8/2022 | Thompson | |
| 11,487,616 | B2 | 11/2022 | Chachad et al. | |
| 11,500,719 | B1 | 11/2022 | Srinivasan | |
| 11,768,733 | B2 * | 9/2023 | Chachad | G06F 11/106 |
| | | | | 714/758 |
| 12,019,514 | B2 | 6/2024 | Thompson | |
| 2002/0184579 | A1 | 12/2002 | Alvarez, II et al. | |
| 2003/0097608 | A1 | 5/2003 | Rodeheffer | |
| 2004/0172581 | A1 | 9/2004 | Tamura | |
| 2004/0236901 | A1 | 11/2004 | Briggs | |
| 2009/0044076 | A1 | 2/2009 | Sugahara | |
| 2009/0313526 | A1 | 12/2009 | Neuman | |
| 2010/0107038 | A1 | 4/2010 | Miura | |
| 2010/0185904 | A1 | 7/2010 | Chen | |
| 2011/0225475 | A1 | 9/2011 | Kumar et al. | |
| 2012/0072796 | A1 | 3/2012 | Chirca | |
| 2014/0006904 | A1 | 1/2014 | Gendler | |
| 2014/0173379 | A1 | 6/2014 | Loh | |
| 2016/0188408 | A1 | 6/2016 | Anderson | |
| 2016/0188429 | A1 | 6/2016 | Noguchi | |
| 2017/0344421 | A1 | 11/2017 | Brandl | |
| 2018/0032282 | A1 | 2/2018 | Hahn | |
| 2018/0190365 | A1 | 7/2018 | Luck | |
| 2019/0095279 | A1 | 3/2019 | Gaikwad | |
| 2019/0102246 | A1 | 4/2019 | Criss | |
| 2019/0102254 | A1 | 4/2019 | Saxena | |
| 2019/0146868 | A1 | 5/2019 | Ranjan | |
| 2019/0146870 | A1 | 5/2019 | Cha et al. | |
| 2019/0196901 | A1 | 6/2019 | Arbel et al. | |
| 2020/0371862 | A1 | 11/2020 | Thompson | |
| 2020/0371875 | A1 | 11/2020 | Thompson et al. | |
| 2022/0391283 | A1 | 12/2022 | Thompson | |
| 2024/0311235 | A1 | 9/2024 | Thompson | |
| 2025/0165393 | A1 * | 5/2025 | Beaudoin | G06F 12/0292 |

FOREIGN PATENT DOCUMENTS

| | | |
|---|---|---|
| CN | 109582484 B | 2/2022 |
| CN | 109074851 B | 9/2023 |

OTHER PUBLICATIONS

Tian Fang, Wang Jing, Zhang Weigong; "High-speed cache compression verification technology using data redundancy", Small Microcomputer System, Sep. 15, 2018.

* cited by examiner

400

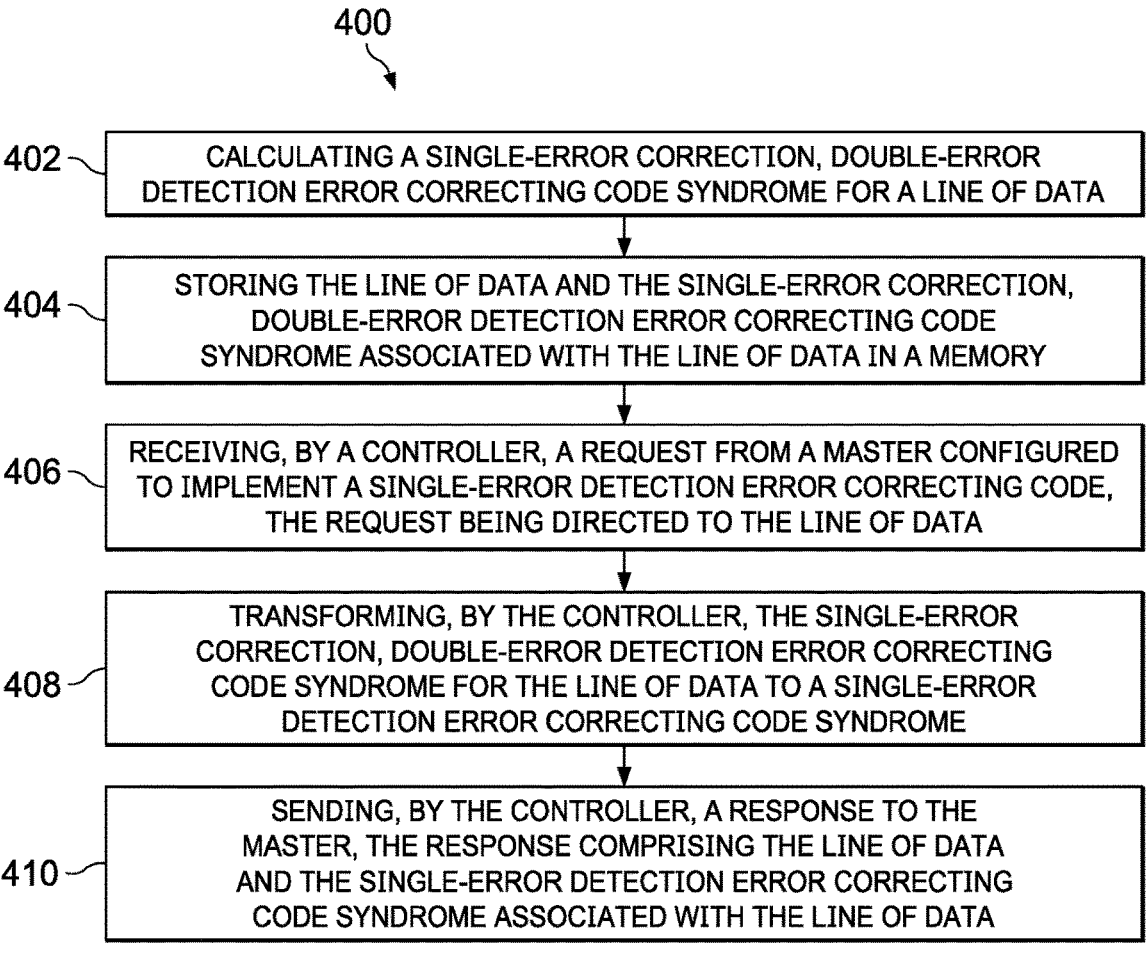

402 — CALCULATING A SINGLE-ERROR CORRECTION, DOUBLE-ERROR DETECTION ERROR CORRECTING CODE SYNDROME FOR A LINE OF DATA

404 — STORING THE LINE OF DATA AND THE SINGLE-ERROR CORRECTION, DOUBLE-ERROR DETECTION ERROR CORRECTING CODE SYNDROME ASSOCIATED WITH THE LINE OF DATA IN A MEMORY

406 — RECEIVING, BY A CONTROLLER, A REQUEST FROM A MASTER CONFIGURED TO IMPLEMENT A SINGLE-ERROR DETECTION ERROR CORRECTING CODE, THE REQUEST BEING DIRECTED TO THE LINE OF DATA

408 — TRANSFORMING, BY THE CONTROLLER, THE SINGLE-ERROR CORRECTION, DOUBLE-ERROR DETECTION ERROR CORRECTING CODE SYNDROME FOR THE LINE OF DATA TO A SINGLE-ERROR DETECTION ERROR CORRECTING CODE SYNDROME

410 — SENDING, BY THE CONTROLLER, A RESPONSE TO THE MASTER, THE RESPONSE COMPRISING THE LINE OF DATA AND THE SINGLE-ERROR DETECTION ERROR CORRECTING CODE SYNDROME ASSOCIATED WITH THE LINE OF DATA

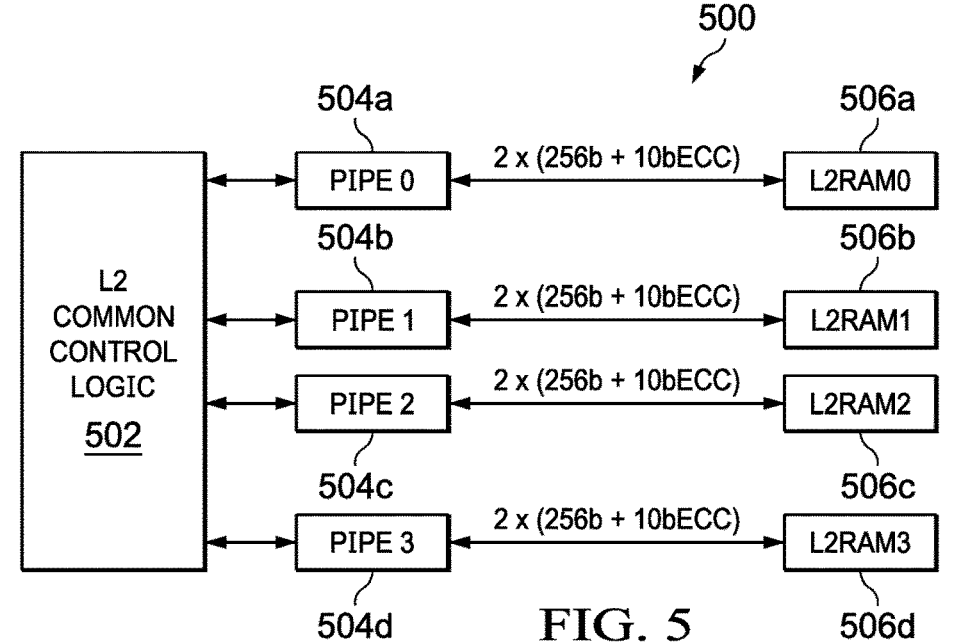

L2 COMMON CONTROL LOGIC 502

504a PIPE 0    2 x (256b + 10bECC)    506a L2RAM0

504b PIPE 1    2 x (256b + 10bECC)    506b L2RAM1

PIPE 2    2 x (256b + 10bECC)    506c L2RAM2

504c PIPE 3    2 x (256b + 10bECC)    506c L2RAM3

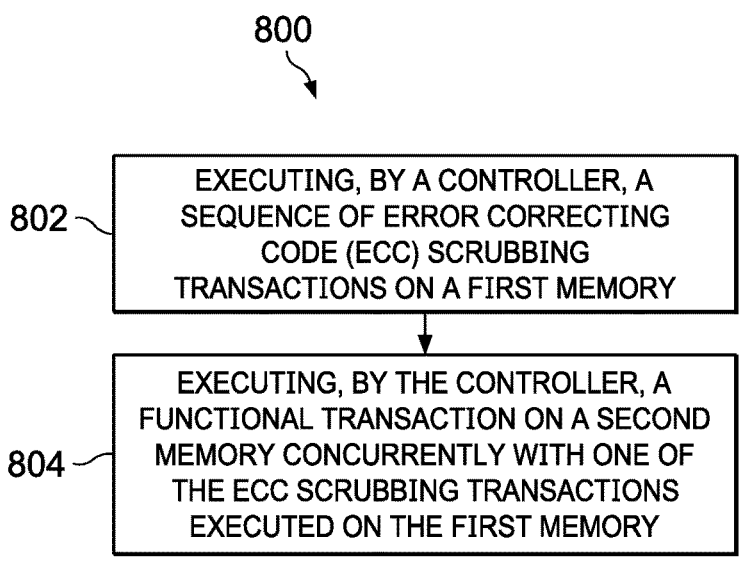

802 — EXECUTING, BY A CONTROLLER, A SEQUENCE OF ERROR CORRECTING CODE (ECC) SCRUBBING TRANSACTIONS ON A FIRST MEMORY

804 — EXECUTING, BY THE CONTROLLER, A FUNCTIONAL TRANSACTION ON A SECOND MEMORY CONCURRENTLY WITH ONE OF THE ECC SCRUBBING TRANSACTIONS EXECUTED ON THE FIRST MEMORY

FIG. 8

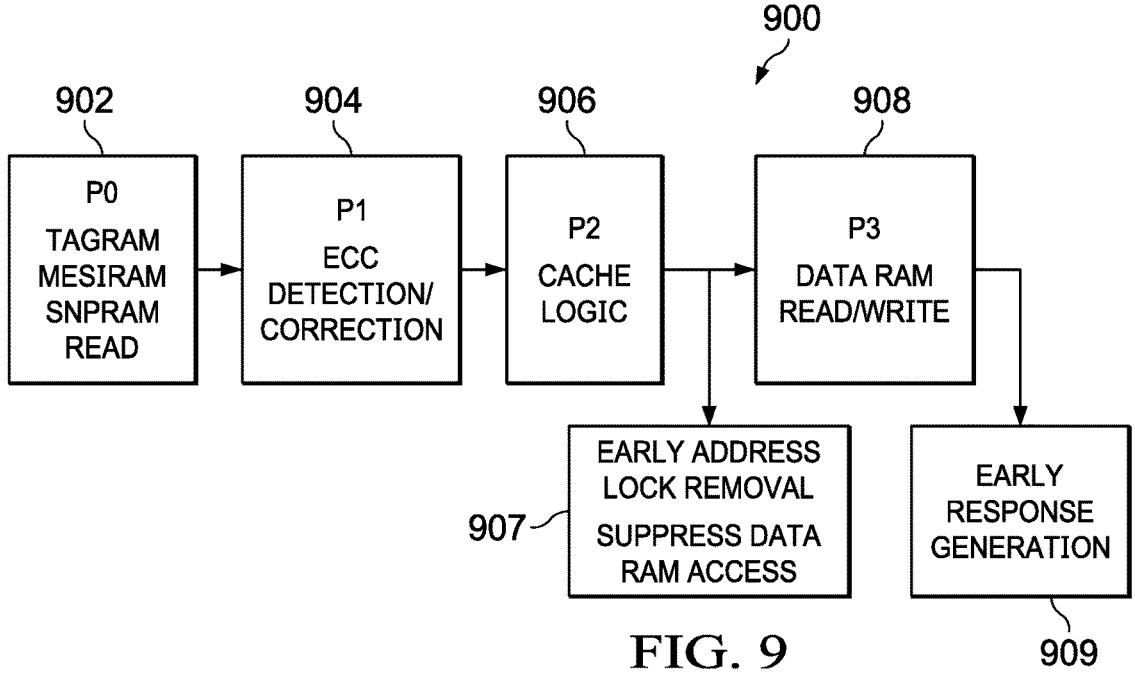

900

902
P0
TAGRAM
MESIRAM
SNPRAM
READ

904
P1
ECC
DETECTION/
CORRECTION

906
P2
CACHE
LOGIC

908
P3
DATA RAM
READ/WRITE

907 — EARLY ADDRESS LOCK REMOVAL
SUPPRESS DATA RAM ACCESS

EARLY RESPONSE GENERATION

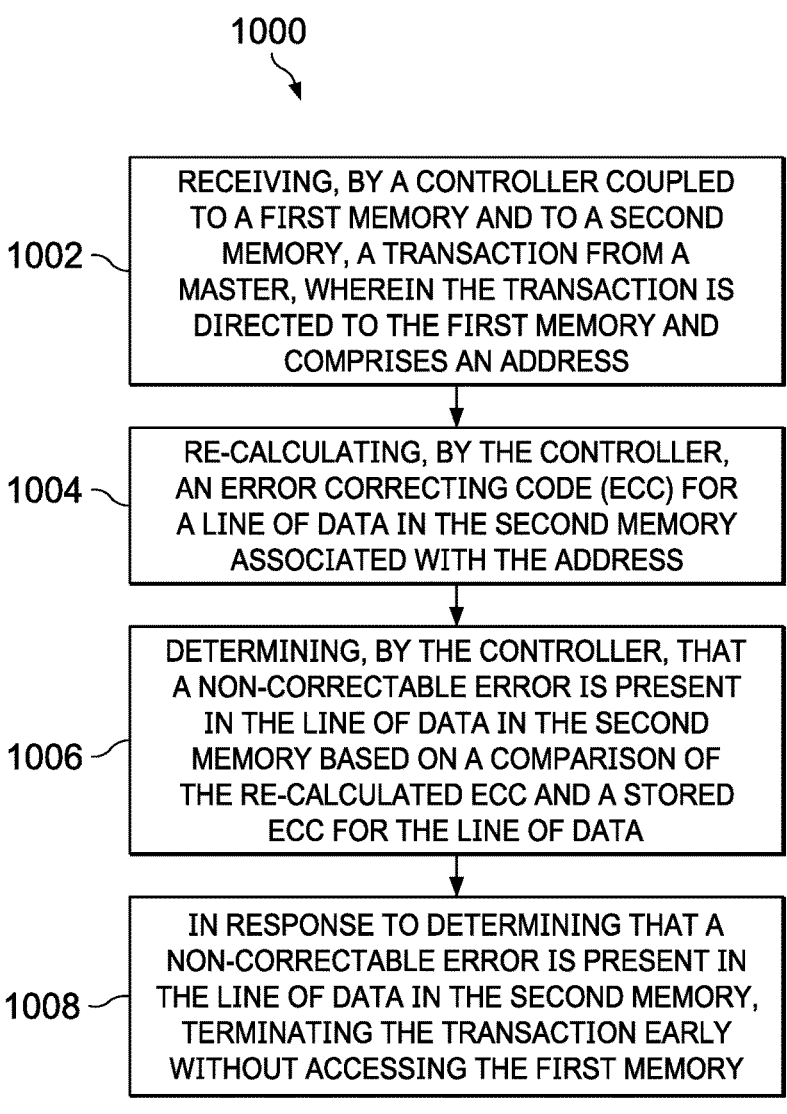

1002 — RECEIVING, BY A CONTROLLER COUPLED TO A FIRST MEMORY AND TO A SECOND MEMORY, A TRANSACTION FROM A MASTER, WHEREIN THE TRANSACTION IS DIRECTED TO THE FIRST MEMORY AND COMPRISES AN ADDRESS

1004 — RE-CALCULATING, BY THE CONTROLLER, AN ERROR CORRECTING CODE (ECC) FOR A LINE OF DATA IN THE SECOND MEMORY ASSOCIATED WITH THE ADDRESS

1006 — DETERMINING, BY THE CONTROLLER, THAT A NON-CORRECTABLE ERROR IS PRESENT IN THE LINE OF DATA IN THE SECOND MEMORY BASED ON A COMPARISON OF THE RE-CALCULATED ECC AND A STORED ECC FOR THE LINE OF DATA

1008 — IN RESPONSE TO DETERMINING THAT A NON-CORRECTABLE ERROR IS PRESENT IN THE LINE OF DATA IN THE SECOND MEMORY, TERMINATING THE TRANSACTION EARLY WITHOUT ACCESSING THE FIRST MEMORY

FIG. 10

ERROR CORRECTING CODES FOR MULTI-MASTER MEMORY CONTROLLER

CROSS-REFERENCE TO RELATED APPLICATIONS

The present application is a continuation of U.S. patent application Ser. No. 17/670,582, filed Feb. 14, 2022, which is a continuation of U.S. patent application Ser. No. 16/882, 372, filed May 22, 2020, which claims priority to U.S. Provisional Patent Application No. 62/852,465, filed May 24, 2019, each of which is incorporated by reference herein in its entirety.

BACKGROUND

Some memory systems include a multi-level cache system, in which a hierarchy of memories (e.g., caches) provides varying access speeds to cache data. A first level (L1) cache is closely coupled to a central processing unit (CPU) core and provides the CPU core with relatively fast access to cache data. A second level (L2) cache is also coupled to the CPU core and, in some examples, is larger and thus holds more data than the L1 cache, although the L2 cache provides relatively slower access to cache data than the L1 cache. Additional memory levels of the hierarchy are possible.

SUMMARY

In accordance with examples, memory systems and components thereof are provided.

In an example, a system comprises a memory controller; multiple memories coupled to the memory controller; and multiple controlling components coupled to the memory controller. The memory controller is configured to calculate an error correction code (ECC) syndrome of a first type for a segment of data; store the segment of data and the ECC syndrome of the first type in a first memory of the multiple memories; receive a request from a controlling component of the multiple controlling components directed to the segment of data, the controlling component configured to implement an ECC syndrome of a second type; transform the ECC syndrome of the first type for the segment of data to the ECC syndrome of the second type; and send a response to the controlling component that includes the segment of data and the ECC syndrome of the second type.

In an example, a system comprises a memory controller; multiple memories coupled to the memory controller; and multiple controlling components coupled to the memory controller. The memory controller is configured to calculate an error correction code (ECC) syndrome of a first type for a segment of data; store the segment of data and the ECC syndrome of the first type in a first memory of the multiple memories; receive a request from a controlling component of the multiple controlling components directed to the segment of data, the controlling component configured to implement an ECC syndrome of a second type; transform the ECC syndrome of the first type for the segment of data to the ECC syndrome of the second type; detect a number of errors, if any, present in the segment of data; correct the error to generate a corrected segment of data based on the transform operation, when it is determined that one error is present in the segment of data; and send a response to the controlling component.

In accordance with an example, a system comprises a memory controller; multiple memories, including a first memory and a second memory, coupled to the memory controller; and multiple controlling components coupled to the memory controller, wherein the memory controller is configured to receive a transaction from a controlling component of the multiple controlling components, the transaction directed to the first memory and including an address; calculate an error correction code (ECC) for a segment of data in the second memory; determine that a non-correctable error is present in the segment of data in the second memory based on a comparison of the calculated ECC and a stored ECC for the segment of data; and terminate the transaction in response to determining that a non-correctable error is present in the segment of data in the second memory.

In accordance with an example, functionality of the memory controller may be implemented as a method or process.

In accordance with an example, functionality of the memory controller may be directed or controlled by a set of instructions on a device-readable medium.

Other examples and features will become apparent from the description below.

BRIEF DESCRIPTION OF THE DRAWINGS

For a detailed description of various examples, reference will now be made to the accompanying drawings in which:

FIG. 4 shows a flow chart of a method for managing error correcting codes (ECCs) across various masters in accordance with various examples;

FIG. 5 shows a block diagram of a level two (L2) controller interfacing with banked memory in accordance with various examples;

FIG. 8 shows a flow chart of a method for performing ECC scrubbing transactions on banked memory in accordance with various examples;

FIG. 9 shows an example L2 pipeline with early transaction termination in the event of a non-correctable error in accordance with various examples; and FIG. 10 shows a flow chart of a method of early transaction termination in the event of a non-correctable error in accordance with various examples.

DETAILED DESCRIPTION

Figures 1, 3:
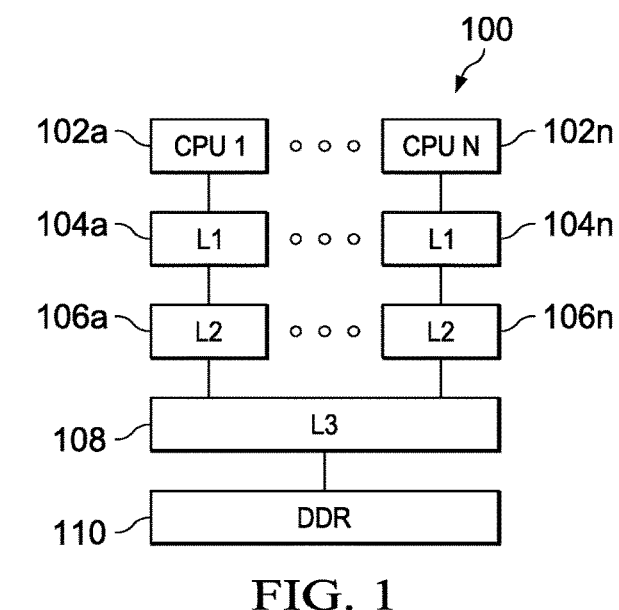
FIG. 1 shows a block diagram of a multi-level cache system in accordance with various examples.
FIG. 3 shows another block diagram of a multi-level cache system including level one (L1) main and victim caches in accordance with various examples.

FIG. 1 shows a block diagram of a system 100 in accordance with an example of this disclosure. The example system 100 includes multiple CPU cores 102a-102n. Each CPU core 102a-102n is coupled to a dedicated L1 cache 104a-104n and a dedicated L2 cache 106a-106n. The L2 caches 106a-106n are, in turn, coupled to a shared third level (L3) cache 108 and a shared main memory 110 (e.g., double data rate (DOR) random-access memory (RAM)). In other examples, a single CPU core 102 is coupled to a L1 cache 104, a L2 cache 106, a L3 cache 108, and main memory 110.

In some examples, the CPU cores 102a-102n include a register file, an integer arithmetic logic unit, an integer multiplier, and program flow control units. In an example, the L1 caches 104a-104n associated with each CPU core 102a-102n include a separate level one program cache (L1P) and level one data cache (L1D). The L2 caches 106a-106n are combined instruction/data caches that hold both instructions and data. In certain examples, a CPU core 102a and its associated L1 cache 104a and L2 cache 106a are formed on a single integrated circuit.

The CPU cores 102a-102n operate under program control to perform data processing operations upon data. Instructions are fetched before decoding and execution. In the example of FIG. 1, L1P of the L1 cache 104a-104n stores instructions used by the CPU cores 102a-102n. A CPU core 102 first attempts to access any instruction from L1P of the L1 cache 104. L1D of the L1 cache 104 stores data used by the CPU core 102. The CPU core 102 first attempts to access any required data from L1 cache 104. The two L1 caches 104 (L1P and L1D) are backed by the L2 cache 106, which is a unified cache. In the event of a cache miss to the L1 cache 104, the requested instruction or data is sought from L2 cache 106. If the requested instruction or data is stored in the L2 cache 106, then it is supplied to the requesting L1 cache 104 for supply to the CPU core 102. The requested instruction or data is simultaneously supplied to both the requesting cache and CPU core 102 to speed use.

The unified L2 cache 106 is further coupled to a third level (L3) cache 108, which is shared by the L2 caches 106a-106n in the example of FIG. 1. The L3 cache 108 is in turn coupled to a main memory 110. As will be explained in further detail below, memory controllers facilitate communication between various ones of the CPU cores 102, the L1 caches 104, the L2 caches 106, the L3 cache 108, and the main memory 110. The memory controller(s) handle memory centric functions such as cacheabilty determination, cache coherency implementation, error detection and correction, address translation and the like. In the example of FIG. 1, the CPU cores 102 are part of a multiprocessor system, and thus the memory controllers also handle data transfer between CPU cores 102 and maintain cache coherence among CPUcores 102. In other examples, the system 100 includes only a single CPU core 102 along with its associated L1 cache 104 and L2 cache 106.

Figure 2:
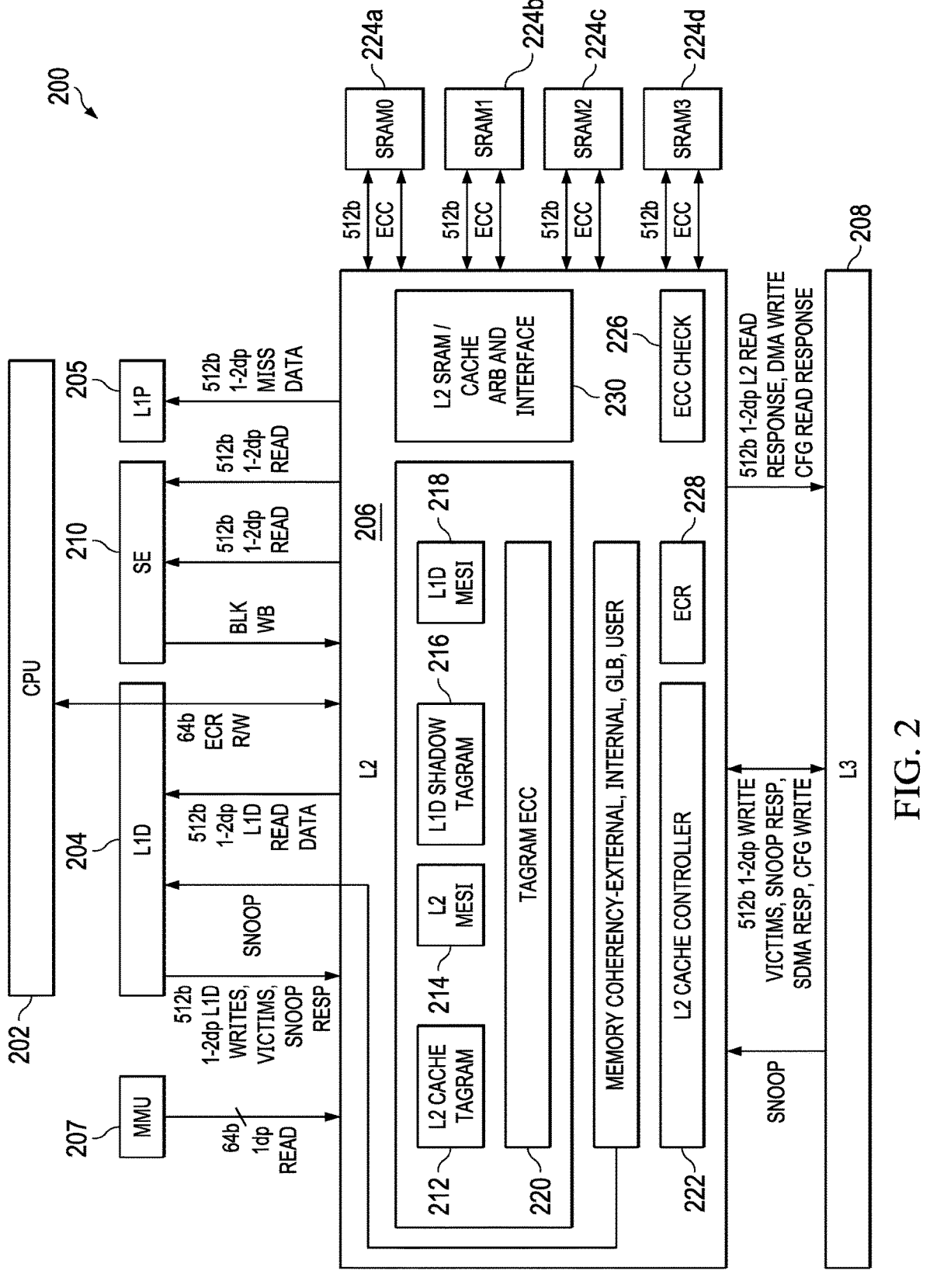
FIG. 2 shows another block diagram of a multi-level cache system in accordance with various examples.

FIG. 2 shows a block diagram of a system 200 in accordance with examples of this disclosure. Certain elements of the system 200 are similar to those described above with respect to FIG. 1, although shown in greater detail. For example, a CPU core 202 is similar to the CPU core 102 described above. The L1 cache 104 subsystem described above is depicted as L1D 204 and L1P 205. The L2 cache 106 described above is shown here as L2 cache subsystem 206. An L3 cache 208 is similar to the L3 cache 108 described above. The system 200 also includes a streaming engine 210 coupled to the L2 cache subsystem 206. The system 200 also includes a memory management unit (MMU) 207 coupled to the L2 cache subsystem 206.

The L2 cache subsystem 206 includes L2 tag ram 212, L2 coherence (e.g., MESI) data memory 214, shadow L1 tag ram 216, and L1 coherence (e.g., MESI) data memory 218. Each of the blocks 212, 214, 216, 218 are alternately referred to as a memory or a RAM. The L2 cache subsystem 206 also includes tag ram error correcting code (ECC) data memory 220. In an example, the ECC data memory 220 maintains ECC data for each of the memories 212, 214, 216, 218.

The L2 cache subsystem 206 includes L2 controller 222, the functionality of which will be described in further detail below. In the example of FIG. 2, the L2 cache subsystem 206 is coupled to memory (e.g., L2 SRAM 224) including four banks 224a-224d. An interface 230 performs data arbitration functions and generally coordinates data transmission between the L2 cache subsystem 206 and the L2 SRAM 224, while an ECC block 226 performs error correction functions. The L2 cache subsystem 206 includes one or more control or configuration registers 228.

In the example of FIG. 2, the L2 SRAM is depicted as four banks 224a-224d. However, in other examples, the L2 SRAM includes more or fewer banks, including being implemented as a single bank. The L2 SRAM 224 serves as the L2 cache and is alternately referred to herein as L2 cache 224.

The L2 tag ram 212 includes a list of the physical addresses whose contents (e.g., data or program instructions) have been cached to the L2 cache 224. In an example, an address translator translates virtual addresses to physical addresses. In one example, the address translator generates the physical address directly from the virtual address. For example, the lower n bits of the virtual address are used as the least significant n bits of the physical address, with the most significant bits of the physical address (above the lower n bits) being generated based on a set of tables configured in main memory. In this example, the L2 cache 224 is addressable using physical addresses. In certain examples, a hit/miss indicator from a tag ram 212 look-up is stored.

The L2 MESI memory 214 maintains coherence data to implement full MESI coherence with L2 SRAM 224, external shared memories, and data cached in L2 cache from other places in the system 200. The functionalities of system 200 coherence are explained in further detail below.

The L2 cache subsystem 206 also shadows L1D tags in the L1D shadow tag ram 216 and L1D MESI memory 218. The tag ram ECC data 220 provides error detection and correction for the tag memories and, additionally, for one or both of the L2 MESI memory 214 and the L1D MESI memory 218. The L2 cache controller 222 generally controls the operations of the L2 cache subsystem 206, including handling coherency operations both internal to the L2 cache subsystem 206 and among the other components of the system 200.

FIG. 3 shows a block diagram of a system 300 that demonstrates various features of cache coherence implemented in accordance with examples of this disclosure. The system 300 contains elements similar to those described above with respect to FIGS. 1 and 2. For example, the CPU core 302 is similar to the CPU cores 102, 202. FIG. 3 also includes a L1 cache subsystem 304, a L2 cache subsystem 306, and an L3 cache subsystem 308. The L1 cache subsystem 304 includes a L1 controller 310 coupled to L1 SRAM 312. The L1 controller 310 is also coupled to a L1 main cache 314 and a L1 victim cache 316, which are explained in further detail below. In some examples, the L1 main and victim caches 314, 316 implement the functionality of L1D 204 and/or L1P 205.

The L1 controller 310 is coupled to a L2 controller 320 of the L2 cache subsystem 306. The L2 controller 320 also couples to L2 SRAM 322. The L2 controller 320 couples to a L2 cache 324 and to a shadow of the L1 main cache 326 as well as a shadow of the L1 victim cache 328. L2 cache 324 and L2 SRAM 322 are shown separately for ease of discussion, although may be implemented physically together (e.g., as part of L2 SRAM 224, including in a banked configuration, as described above. Similarly, the shadow L1 main cache 326 and the shadow L1 victim cache 328 may be implemented physically together, and are similar to the L1D shadow tag ram 216 and the L1D MESI 218, described above. The L2 controller 320 is also coupled to a L3 controller 309 of the L3 cache subsystem 308. L3 cache and main memory (e.g., DOR 110 described above) are not shown for simplicity.

Cache coherence is a technique that allows data and program caches, as well as different requestors (including requestors that do not have caches) to determine the most current data value for a given address in memory. Cache coherence enables this coherent data value to be accurately reflected to observers (e.g., a cache or requestor that issues commands to read a given memory location) present in the system 300. Certain examples of this disclosure refer to an exemplary MESI coherence scheme, in which a cache line is set to one of four cache coherence states: modified, exclusive, shared, or invalid. Other examples of this disclosure refer to a subset of the MESI coherence scheme, while still other examples include more coherence states than the MESI coherence scheme. Regardless of the coherence scheme, cache coherence states for a given cache line are stored in, for example, the L2 MESI memory 214 described above.

A cache line having a cache coherence state of modified indicates that values in the cache line are modified with respect to main memory (e.g., DOR 110), and the values in the cache line are held exclusively in the current cache (e.g., the L2 cache 324). A modified cache coherence state also indicates that the values in the cache line are explicitly not present or not valid in any other caches (e.g., L1 or L3 caches).

A cache line having a cache coherence state of exclusive indicates that the values in the cache line are not modified with respect to main memory (e.g., DOR 110), but the values in the cache line are held exclusively in the current cache (e.g., the L2 cache 324). An exclusive cache coherence state also indicates that the values in the cache line are explicitly not present or not valid in any other caches (e.g., L1 or L3 caches).

A cache line having a cache coherence state of shared indicates that the values in the cache line are not modified with respect to main memory (e.g., DOR 110). A shared cache state also indicates that the values in the cache line may be present in multiple caches (e.g., caches in addition to the L2 cache 324).

A cache line having a cache coherence state of invalid indicates that any values in the cache line are to be treated as if they are not present in the cache (e.g., the L2 cache 324).

Examples of this disclosure leverage hardware techniques, control logic, and/or state information to implement a coherent system. Each observer can issue read requests—and certain observers are able to issue write requests—to memory locations that are marked shareable. Caches in particular can also have snoop requests issued to them, requesting that their cache state be read, returned, or even updated, depending on the type of the snoop operation. In the exemplary multi-level cache hierarchy described above, the L2 cache subsystem 306 is configured to both send and receive snoop operations. The L1 cache subsystem 304 receives snoop operations, but does not send snoop operations. The L3 cache subsystem 308 sends snoop operations, but does not receive snoop operations. In examples of this disclosure, the L2 cache controller 320 maintains state information (e.g., in the form of hardware buffers, memories, and logic) to additionally track the state of coherent cache lines present in both the L1 main cache 314 and the L1 victim cache 316. Tracking the state of coherent cache lines enables the implementation of a coherent hardware cache system.

Examples of this disclosure refer to various types of coherent transactions, including read transactions, write transactions, snoop transactions, victim transactions, and cache maintenance operations (CMO). These transactions are at times referred to as reads, writes, snoops, victims, and CMOs, respectively.

Reads return the current value for a given address, whether that value is stored at the endpoint (e.g., DOR 110), or in one of the caches in the coherent system 300. Writes update the current value for a given address, and invalidate other copies for the given address stored in caches in the coherent system 300. Snoops read or invalidate (or both) copies of data stored in caches. Snoops are initiated from a numerically-higher level of the hierarchy to a cache at the next, numerically-lower level of the hierarchy (e.g., from the L2 controller 320 to the L1 controller 310), and are able be further propagated to even lower levels of the hierarchy as needed. Victims are initiated from a numerically-lower level cache in the hierarchy to the next, numerically-higher level of the cache hierarchy (e.g., from the L1 controller 310 to the L2 controller 320) or from a main cache in a given level to a victim cache in the same level. Victims transfer modified data to the next level of the hierarchy and/or to the victim cache. In some cases, victims are further propagated to numerically-higher levels of the cache hierarchy (e.g., if the L2 controller 310 sends a victim to the L2 controller 320 for an address in the DOR 110, and the line is not present in the L2 cache 324, the L2 controller 320 forwards the victim to the L3 controller 309). Finally, CMOs cause an action to be taken in one of the caches for a given address.

Still referring to FIG. 3, in one example, the L1 main cache 314 is a direct mapped cache that services read and write hits and snoops. The L1 main cache 314 also keeps track of cache coherence state information (e.g., MESI state) for its cache lines. In an example, the L1 main cache 314 is a read-allocate cache. Thus, writes that miss the L1 main cache 314 are sent to L2 cache subsystem 306 without allocating space in the L1 main cache 314. In the example where the L1 main cache 314 is direct mapped, when a new allocation takes place in the L1 main cache 314, the current line in the set is moved to the L1 victim cache 316, regardless of whether the line is clean (e.g., unmodified) or dirty (e.g., modified).

In an example, the L1 victim cache 316 is a fully associative cache that holds cache lines that have been removed from the L1 main cache 314, for example due to replacement. The L1 victim cache 316 holds both clean and dirty lines. The L1 victim cache 316 services read and write hits and snoops. The L1 victim cache 316 also keeps track of cache coherence state information (e.g., MESI state) for its cache lines. When a cache line in the modified state is replaced from the L1 victim cache 316, that cache line is sent to the L2 cache subsystem 306 as a victim.

As explained above, the L2 cache subsystem 306 includes a unified L2 cache 324 that is used to service requests from multiple requestor types, including L1D and L1P (through the L1 controller 310), the streaming engine 210, a memory management unit (MMU 207), and the L3 cache (through the L3 controller 309). In an example, the L2 cache 324 is non-inclusive with the L1 cache subsystem 304, which means that the L2 cache 324 is not required to include all cache lines stored in the L1 caches 314, 316, but that some lines may be cached and valid in both levels. Continuing this example, the L2 cache 324 is also non-exclusive, which means that cache lines are not explicitly prevented from being cached and valid in both the L1 and L2 caches 314, 316, 324. For example, due to allocation and random replacement, cache lines may be present and valid in one, both, or neither of the L1 and L2 caches. The combination of non-inclusive and non-exclusive cache policies enables the L2 controller 320 to manage its cache contents without requiring the L1 controller 310 to invalidate or remove cache lines. This simplifies processing in the L2 cache subsystem 306 and enables increased performance for the CPU core 302 by allowing critical data to remain cached in the L1 cache subsystem 304 even if it has been evicted from the L2 cache 324.

Still referring to FIG. 3, in some examples, the L2 controller 320 described herein combines both local coherence (e.g., handling requests targeting its local L2 SRAM 322 as an endpoint) and external coherence (e.g., handling requests targeting external memories, such as L3 SRAM (not shown for simplicity) or DOR 110 as endpoints). An endpoint refers to a memory target such as L2 SRAM 322 or DOR 110 that resides at a particular location on the chip, is acted upon directly by a single controller and/or interface, and may be cached at various levels of a coherent cache hierarchy, such as depicted in FIG. 3. A master (e.g., a hardware component, circuitry, or the like) refers to a requestor that issues read and write accesses to an endpoint. In some examples, a master stores the results of these read and write accesses in a cache, although the master does not necessarily store such results in a cache.

The occurrence of soft errors in memory is a reason for failure of various applications. These soft errors occur due to random radiation flipping a bit within the memory. In some examples, one or more parity bits are stored along with data to detect such errors.

Error correcting codes (ECC) are used as a measure for protecting memories against transient and permanent faults that occur during functional operation. Protecting against such faults and the ability to continue operating in the presence of such faults is referred to as "safety" or "functional safety". In examples of this disclosure, various components of the systems described above implement different levels of ECC protection, including zero protection, single-error detection (SEO), and single-error correction, double-error detection (SECDED).

In examples of this disclosure, functionalities related to various ECC processing, determinations, methods, and the like are generally ascribed to the L2 controller 222 (and/or the L2 controller 320 equivalently shown in FIG. 3). However, it should be appreciated that in some examples, the L2 controller 222 carries out such functionality in conjunction with other blocks in FIG. 2, such as the ECC check block 226 and the ECC data memory 220, which in at least some cases comprises ECC syndromes for various ones of the memories described as part of the L2 cache subsystem in FIGS. 1-3.

Various different memories present in the systems described above in FIGS. 1-3 have different functional safety requirements, while various masters present in those systems are configured to offer varying levels of ECC protection. Examples of this disclosure address the resulting complexities of maintaining adequate functional safety throughout the systems sufficient to satisfy, for example, failure in time (FIT) rates dictated by product requirements.

In particular, the L2 controller 222 provides several safety solutions, including the maintenance of ECCs for its banked SRAM memories 224a-224d, maintaining required ECCs for data-bearing transactions across interfaces to other entities outside of the L2 cache subsystem 206, and transforming ECCs across heterogeneous interfaces to entities outside of the L2 cache subsystem 206. The L2 controller 222 is also configured to implement various scrubbing transactions to maintain and update ECG-protected memories (e.g., to correct for soft errors occurring in those memories).

The L2 controller 222 receives multiple transaction types from various masters, including LID 204, LIP 205, SE 210, MMU 207, and L3 208. Further, in an example, the L2 SRAM 224, which serves as both directly addressable memory and the data backing for the L2 cache, is parity protected with a SECOEO ECC syndrome for each 32-byte datum. There are multiple transaction types that contain both data and a SECOEO ECC syndrome. For example, write transactions, read responses, and snoop responses all include data and a SECOEO ECC syndrome, and these transactions can result in updating the L2 SRAM 224.

In some cases, partial updates to the L2 SRAM 224 employ a "read-modify-write" operation to preserve the integrity of the SECOEO ECC syndrome, for example by correcting a single soft error in stored data and generating an updated SECOEO ECC syndrome based on the corrected data. In other cases, full line writes or full line responses enable an optimization where a read-modify-write operation is unnecessary and one or more full 32-byte data values can be updated directly using accompanying SECOEO ECC syndromes. In still other cases, transformations are made on the parity protection information to transform an ECC syndrome from SECOEO to SEO before returning a read response to an initiating master. In the following examples, the L2 controller 222 maintains SECOEO parity protection on its L2 SRAM 224, while also managing the individual master requirements for parity protection, particularly for masters that utilize SEO parity protection.

As explained further below, the L2 controller 222 managing the different ECC requirements of different masters enables the multiple, different masters, to access the common collection of L2 SRAM 224 (e.g., which is itself protected using a SECOEO ECC scheme) managed by the L2 controller 224. Thus, different topologies of master interfaces to the same shared L2 SRAM 224, while benefiting from the relatively stronger SECOEO protection in the L2 SRAM 224, while enabling each master to manage its own memories at a different safety level as permitted or required.

In some examples, the L2 controller 222 is configured to maintain SECOEO parity for the memories 212, 214, 216, 218 (e.g., by way of the ECC block 220) in addition to maintaining SECOEO parity for the L2 SRAM 224. In various examples, it is assumed that at least some of the masters to which the L2 cache subsystem 206 couple employ SEO parity protection rather than SECOEO protection as employed by the L2 cache subsystem 206. In one example, LIP 205, SE 210, and MMU 207 use SEO protection instead of SECOEO protection. The L2 controller 222 is configured to transform SECOEO ECC syndromes to SEO ECC syndromes when returning read response data to these masters.

FIG. 4 shows a flow chart of a method 400 in accordance with various examples. The method 400 relates to the L2 controller 222 managing and transforming ECCs across heterogeneous interfaces to entities outside of the L2 cache subsystem 206.

The method 400 begins in block 402 with the L2 controller 222 calculating a SECOEO ECC syndrome for a line of data. The method 400 continues in block 404 with the L2 controller 222 storing the line of data and the SECOEO ECC syndrome associated with the line of data in a memory, such as the L2 SRAM 224.

The method 400 proceeds to block 406, in which the L2 controller 222 receives a request from a master configured to implement a SEO ECC (e.g., one of the LIP 205, SE 210, and MMU 207 described above). In this example, the request is directed to the line of data stored by the L2 controller 222 in the L2 SRAM 224 using a SECOEO ECC syndrome.

Before the L2 controller 222 responds to the request, the method 400 continues to block 408 where the L2 controller 222 transforms the SECOEO ECC syndrome for the line of data to a SEO ECC syndrome. Then, the method 400 proceeds to block 410 in which the L2 controller 222 sends a response to the master that includes the line of data and the SEO ECC syndrome associated with the line of data (e.g., the SEO ECC syndrome that the initial SECOEO ECC syndrome was transformed to).

In an example, when transforming the SECOEO ECC syndrome for the line of data to the SEO ECC, the L2 controller 222 is further configured to re-calculate a SECOEO ECC syndrome for the line of data (e.g., based on the current data in L2 SRAM 224). In this example, the L2 controller 222 then determines that a single error is present in the line of data based on a comparison of the re-calculated SECOEO ECC syndrome and the SECOEO ECC syndrome associated with the line of data (e.g., stored in the ECC block 220). As a result of detecting a single error, which is correctable when protected with a SECOEO ECC syndrome, the L2 controller 222 is configured to overwrite the line of data in the memory with a corrected line of data, in which single error is corrected. Finally, the L2 controller 222 is configured to calculate the SEO ECC syndrome based on the corrected line of data, and then send the response to the master. In an example, the response to the master including the associated SEO ECC syndrome is transmitted in a single bus transaction. As a result, the L2 controller 222 is configured not only to manage ECCs across heterogeneous interfaces, but also to correct errors as part of the transaction.

In another example, the L2 controller 222 determines that more than one error is present in the line of data based on a comparison of the re-calculated SECDED ECC syndrome and the SECDED ECC syndrome associated with the line of data (e.g., stored in the ECC block 220). As a result of detecting a double error (or greater), which is detectable but not correctable when protected with a SECDED ECC syndrome, the L2 controller 222 is configured to generate an interrupt to the requesting master to signal the error in the requested data. In some cases, the L2 controller 222 does not have visibility to how a particular master will handle the error-interrupt, although the requesting master is thus able to determine (e.g., based on safety-criticality of the transaction) how to handle the error-interrupt.

As explained above, in some examples the L2 controller 222 is configured to interface with a banked memory structure, such as the four banks of L2 SRAM 224 shown in FIG. 2. FIG. shows another view of this structure 500, which includes common L2 control logic 502 that is coupled to four banked L2 SRAM blocks 506a-506d by way of four parallel pipelines 504a-504d. In the example of FIG. 5, accesses to the L2 SRAM 506 include 256b of data+10b of ECC syndrome, such as a SECDED syndrome. For the purposes of the following examples, the L2 control logic 502 and the L2 controller 222 are functionally similar, as is the banked L2 SRAM 506 and the L2 SRAM 224. Examples of this disclosure leverage the parallel pipeline 504 access to the banked L2 SRAM 506 to increase efficiency of performing ECC scrubbing operations on the L2 SRAM 506. ECC scrubbing operations are explained further below, but generally refer to the periodic correction and/or detection of soft errors in the L2 SRAM 506. Particularly for safety-critical applications, such periodic correction and/or detection of errors increases the functionality of the overall system in such applications.

As explained, the L2 controller 502 leverages the banked nature of the L2 SRAM 506 and the parallel pipelines 504 to carry out ECC scrubbing operations independently on each pipeline, which reduces a performance penalty (e.g., from interrupting transactions) to the overall system by carrying out scrubbing operations on individual pipelines. This also reduces performance dependencies on other pipelines. For example, any pipeline that is not currently engaging in ECC scrubbing operations is able to operate on functional transactions, which reduces the impact of the scrubber operation on other critical, mission-mode applications.

Figures 6, 7:
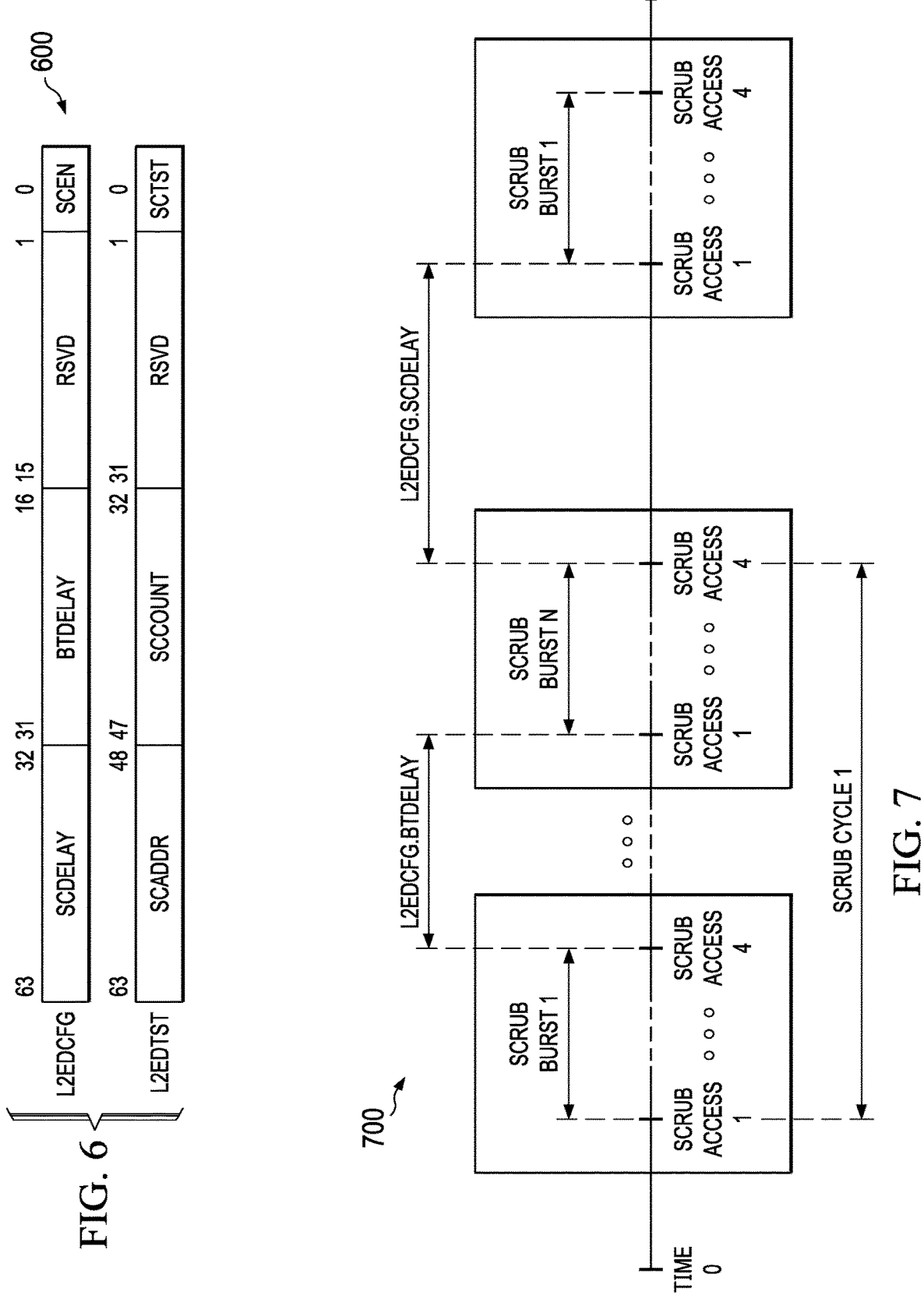
FIG. 6 shows example configuration registers used in ECC scrubbing transactions in accordance with various examples.
FIG. 7 shows an example timeline of an ECC scrubbing transaction in accordance with various examples.

FIG. 6 shows registers 600 in accordance with certain examples. In these examples, scrubber logic operating on each pipeline is configured by the two control registers 600, L2EDCFG (e.g., a scrubber control register) and L2EDTST (e.g., a test control register). In some examples, these control registers 600 are written by configuration code prior to program execution, and remain in effect until subsequent update to the control registers take place.

The scrubber control register generally controls the frequency of scrubbing operations. The SCEN (e.g., enable) field of the scrubber control register is an enable bit in this example. When SCEN is asserted, scrubbing operations occur according to the values of SCDELAY and BTDELAY, explained further below. When SCEN is de-asserted, no scrubbing operations occur.

The BTDELAY (e.g., burst delay) field controls the delay between consecutive scrub bursts. In some examples, the integer value captured in the burst delay field represents a single clock cycle of delay. Scrub bursts are explained in further detail below.

The SCDELAY (e.g., cycle delay) field controls the delay between the end of one scrub cycle and the start of the next scrub cycle. In one example, in a functional mode, the integer value captured in the cycle delay field represents 1,024 clock cycles of delay (although other scaling multipliers are within the scope of this disclosure). In another example, in a test mode (explained further below), the integer value captured in the cycle delay field represents a single clock cycle of delay. Scrub cycles are explained in further detail below.

The test control register controls test mode for the scrubber logic and enables programmatically, selectively scrubbing specific regions or addresses of the L2 SRAM 506. The SCTST (e.g., test enable) field of the test control register controls the test mode of the scrub process. While the SCEN field described above remains the overall enable for the scrub process, if SCEN is asserted, the SCTST being asserted causes the scrubber logic to enter test mode.

The SCADDR (e.g., test address) field specifies the starting address in the L2 SRAM 506 for the next test mode scrub cycle.

The SCCOUNT (e.g., test count) field controls the number of scrub accesses that will occur during the next scrub cycle.

Reference was made above to scrub accesses, scrub bursts, and scrub cycles. These concepts are explained with further reference made to FIG. 7, which shows an example timeline 700 of an ECC scrubbing operation in accordance with various examples.

A scrub access is the smallest granularity of scrubbing that takes place, and consists of the read-modify-write of a single address in the L2 SRAM 506. In an example, a scrub access only modifies the data at the given address if there is a one-bit error (e.g., detectable and correctable by the SECDED ECC syndrome stored at the location in the L2 SRAM 506). If there is no error detected by the scrub access, then no operation is required to be performed. However, if there is a two-bit error detected in the L2 SRAM 506 (e.g., detectable but not correctable by the SECDED ECC syndrome stored at the location in the L2 SRAM 506), an interrupt to signify the error is generated and a write operation is not performed. As above, although the L2 controller 222 does not have visibility to how a particular master will handle the error-interrupt, the L2 controller 222 provides knowledge of the error to a master, which can determine (e.g., based on safety-criticality of the transaction) how to handle the error-interrupt.

A scrub burst is a series of consecutive scrub accesses that occur consecutively (e.g., without pause or delay between scrub accesses). The delay between scrub bursts (e.g., the time between the last scrub access of a scrub burst and the first scrub access of the subsequent scrub burst) is software programmable, and controlled by the burst delay (e.g., BTDELAY) scrubber control register field, explained above. In some examples, the number of scrub accesses per scrub burst is fixed (e.g., 4 scrub accesses per scrub burst in the example of FIG. 7), while in other examples, the number of scrub accesses per scrub burst is fixed to a different value, or is configurable (e.g., with an additional control register field).

Finally, a scrub cycle is the largest granularity of scrubbing that takes place, and consists of multiple scrub bursts that occur regularly, with the delay between bursts programmable with the burst delay (e.g., BTDELAY) scrubber control register field, explained above. In one example, a complete scrub cycle results in scrubbing the entire contents of the bank of L2 SRAM 506. The delay between the end of a complete scrub cycle and the start of the next scrub cycle (e.g., the time between the last scrub access of the last scrub burst of a scrub cycle and the first scrub access of the first scrub burst of the subsequent scrub cycle) is software programmable, and controlled by the cycle delay (e.g., SCDELAY) scrubber control register field, explained above.

In an example, the L2 SRAM 506 scrubber is implemented with several finite state machines (e.g., implemented in the L2 controller 222 or the pipelines 504 themselves). These state machines interact with each other both during functional and test modes. In an example, the scrubber logic is replicated across all four pipelines 504, resulting in a parallel scrubber implementation that allows each pipeline 504 to operate independently of the other pipelines 504. As a result, while one pipeline 504 requests and begins a scrub cycle, the other pipelines 504 are still processing functional transactions. In one example, the scrubber control register and the test control register control the pipelines 504 in a global manner. When controlled globally, it is not possible for one pipeline 504 to be in the test mode, while another pipeline 504 is in the functional mode. Similarly, when controlled globally, scrubbing in functional mode is either enabled or disabled for all pipelines 504.

In response to the enable field of the scrub control register (e.g., SCEN) being asserted, while the test enable field of the test control register (e.g., SCTST) is de-asserted, the scrubber state machine (e.g., implemented in the pipeline 504) operates in functional mode. In one example, a countdown timer begins as a result and counts down until a threshold is reached (e.g., after SCDELAY*1,024 clock cycles have elapsed). Once the countdown is complete (e.g., a threshold value is reached by the countdown timer), the scrubber state machine requests a scrub burst. Before the scrub burst can begin, the associated L2 pipeline 504 must flush all existing functional transactions. Thus, the scrubber state machine also asserts a stall request signal to the L2 controller 502, which prevents new transactions from winning arbitration and entering the pipeline 504. Once the inflight transactions complete, the pipeline is considered flushed of transactions, and an acknowledge signal is given to the scrubber state machine by the L2 controller 502. In response to the flush acknowledge signal being asserted, the scrubber state machine begins the first scrub burst (e.g., a sequence of scrubbing transactions). In an example, the scrubber state machine presents an address and a scrub access request to control logic of the L2 SRAM 506, which causes the given address to undergo a scrub access to detect and correct any one-bit errors at that location, as explained above.

In some examples, while the various pipelines 504 begin to operate with the same functional delay, and thus begin their first scrub cycles at approximately the same time, the scrubbing operations of the pipelines become decoupled over time. For example, the pipeline 504 stalling mechanism described above will take different numbers of cycles for the various pipelines 504. Additionally, scrubbing operations are carried out more or less quickly on the various banks of the L2 SRAM 506, further adding to the variability over time of when each pipeline 504 is processing scrubbing transactions or functional transactions.

In response to the enable field of the scrub control register (e.g., SCEN) being asserted, while the test enable field of the test control register (e.g., SCTST) is also asserted, the scrubber state machine (e.g., implemented in the pipeline 504) operates in test mode. The scrubber state machine operates similarly in test mode as in functional mode, described above, with the following differences. In one example, while a countdown timer is still utilized, the cycle delay field is not scaled (e.g., not multiplied by 1,024 as in the above example), which results in faster scrub bursts as a result of less time between scrub cycles. Additionally, rather than beginning a scrub cycle at the beginning (e.g., address 0) of the L2 SRAM 506, in test mode the starting address for a scrub cycle is given by the test address (e.g., SCADDR) field of the test control register. Further, rather than scrubbing an entire bank of the L2 SRAM 506, a total number of scrub accesses is given by the test count (e.g., SCCOUNT) field of the test control register. The test mode improves debugging and testing of various aspects of the L2 SRAM 506 scrubbing operations described herein.

FIG. 8 shows a flow chart of a method 800 for performing ECC scrubbing transactions on banked memory in accordance with various examples. The method 800 begins in block 802 with the L2 controller 502 executing a sequence of ECC scrubbing transactions on a first memory (e.g., L2 SRAM 506a). As explained above, in certain examples the L2 controller 502 operates in conjunction with state machines in the pipeline 504 to carry out ECC scrubbing transactions on the L2 SRAM 506. The method 800 also includes, in block 804, the L2 controller 502 executing a functional transaction (e.g., not an ECC scrubbing transaction) on a second memory (e.g., L2 SRAM 506b) concurrently with the ECC scrubbing transactions executing on the first memory. As a result, overall performance dependencies on ECC scrubbing operations are reduced, since any pipeline 504 that is not currently engaging in ECC scrubbing operations is able to operate on functional transactions. This reduces the impact of the scrubber operations on other critical, mission-mode applications of the system.

As explained above, different system components implement different levels of protection, from zero protection, to SEO protection, to SECDED protection. Regardless of the protection employed, when a particular transaction encounters a non-correctable error, an interrupt is generated for a system-level response (e.g., by a controlling master) to the error. Generating an interrupt is preferable because, in at least some cases, an initiating master does not otherwise receive notification of the non-correctable error in the form of a response status. In examples of this disclosure, the L2 controller 222 continues to process functional (e.g., mission-mode) transactions even after detecting a non-correctable error related to a transaction, because the L2 controller 222 does not necessarily possess enough system-level information to know whether the detected non-correctable error was a critical or non-critical error.

Examples of the present disclosure improve the performance of the L2 controller 222 in the presence of non-correctable errors. In particular, processing transactions that encounter non-correctable errors is simplified, while power consumption and latency are reduced while processing these transactions.

As will be explained in further detail below, the L2 controller 222 is configured to terminate the processing of a transaction early in response to a non-correctable error being detected. Early termination of a transaction for which an associated non-correctable error has been detected also enables the L2 controller 222 to provide an earlier response (e.g., an error interrupt) to an initiating master, further reducing latency. Early termination of a transaction for which an associated non-correctable error has been detected also enables the L2 controller 222 to avoid memory access (e.g., an access to L2 SRAM 224 that otherwise would have resulted from the transaction), which reduces power consumption.

Turning to FIG. 9, a block diagram of the L2 pipeline 900 in accordance with an example of this disclosure. As shown, the L2 pipeline 900 is a multi-stage pipeline with memory accesses occurring in stage PO (902), ECC detection and correction occurring in stage P1 (904), various cache logic occurring in stage P2 (906), and L2 SRAM 224 access occurring in stage P3 (908).

In particular, the L2 controller 222 is configured to receive a transaction from a master. The transaction is directed, for example, to the L2 SRAM 224 and includes an address. In an example, in stage PO (902), the L2 controller 222 accesses one or more of the L2 tag memory 212, L2 coherence memory 214, and L1 shadow tag memory 216 based on the address of the transaction. As explained above, the L2 controller 222 is configured to maintain SECDED parity for the memories 212, 214, 216, 218 (e.g., by way of the ECC block 220) in addition to maintaining SECDED parity for the L2 SRAM 224.

Thus, in stage P1 (904), the L2 controller 222 is configured to re-calculate an error correcting code (ECC) for a line of data (e.g., tag data in L2 tag memory 212, coherence data in L2 coherence memory 214, or shadow tag data in L1 shadow tag memory 216) associated with the address of the transaction. The L2 controller 22 is configured to determine that a non-correctable error is present in one (or more) of the tag data, coherence data, or shadow tag data based on a comparison of the re-calculated ECC and a stored ECC (e.g., in ECC block 220) for the line of data. In response to determining that a non-correctable error is present in one (or more) of the tag data, coherence data, or shadow tag data, the L2 controller 222 is configured to terminate the transaction early without accessing the first memory, as shown in block 907.

Additionally, when the L2 controller 222 detects a non-correctable error as described above, logic in the stage P2 (906) releases the address locks, which enables the L2 controller 222 to continue processing transactions subsequent to the transaction for which a non-correctable error was detected. Further, when the L2 controller 222 detects a non-correctable error as described above, logic in the stage P2 (906) prevents an access to L2 SRAM 224 in stage P3 (908), which reduces power consumption.

FIG. 10 shows a flow chart of a method 1000 of early transaction termination in the event of a non-correctable error in accordance with various examples. The method 1000 begins in block 1002, in which the L2 controller 222 receives a transaction from a master. The transaction is directed to a first memory (e.g., L2 SRAM 224) and includes an address. The method 1000 continues in block 1004 in which the L2 controller 222 recalculates an ECC for a line of data in a second memory (e.g., tag data in L2 tag memory 212, coherence data in L2 coherence memory 214, or shadow tag data in L1 shadow tag memory 216) associated with the address of the transaction.

The method 1000 then continues in block 1006 with the L2 controller 222 determining that a non-correctable error is present in the line of data in the second memory based on a comparison of the re-calculated ECC and a stored ECC for the line of data (e.g., in ECC block 220). In response to determining that a non-correctable error is present in the line of data in the second memory, the method 1000 continues in block 1008 with the L2 controller 222 terminating the transaction early and without accessing the first memory (e.g., L2 SRAM 224). As explained above, in addition to terminating the transaction early, the method may include the L2 controller generating a response (e.g., an interrupt) to the master indicating the presence of the non-correctable error.

In the foregoing discussion and in the claims, the terms "including" and "comprising" are used in an open-ended fashion, and thus mean "including, but not limited to . . . ." Also, the term "couple" or "couples" means either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is illustrative of the principles and various embodiments of the present disclosure. Numerous variations and modifications will become apparent to those skilled in the art once the above disclosure is fully appreciated. The following claims should be interpreted to embrace all such variations and modifications.

What is claimed is:

1. A system comprising:
a memory controller;
multiple memories coupled to the memory controller; and
multiple controlling components coupled to the memory controller;
wherein the memory controller is operable to:
calculate an error correction code (ECC) syndrome of a first type for a segment of data; store the segment of data and the ECC syndrome of the first type in a first memory of the multiple memories;
receive a request from a controlling component of the multiple controlling components directed to the segment of data, the controlling component operable to implement an ECC syndrome of a second type;
transform the ECC syndrome of the first type for the segment of data to the ECC syndrome of the second type; and
send a response to the controlling component that includes the segment of data and the ECC syndrome of the second type.

2. The system of claim 1, wherein the multiple controlling components include a level one program cache memory, a streaming engine, and a memory management unit.

3. The system of claim 1, wherein the ECC syndrome of the second type provides less error protection than the ECC syndrome of the first type.

4. The system of claim 1, wherein the first type is a single-error correction, double-error detection (SECDED) type, and the second type is a single-error detection (SED) type.

5. The system of claim 1, wherein the multiple memories include multiple banks of static random-access memory (SRAM).

6. The system of claim 1, wherein the memory controller is a level two (L2) cache controller.

7. The system of claim 1, wherein, to transform the ECC syndrome of the first type for the segment of data to the ECC syndrome of the second type, the memory controller is operable to recalculate the ECC syndrome of the first type based on the segment of data in the memory controller.

8. The system of claim 7, wherein the memory controller is further operable to detect that a single error is present in the segment of data based on a comparison of the recalculated ECC syndrome of the first type and the ECC syndrome of the first type associated with the stored segment of data.

9. The system of claim 8, wherein the memory controller is further operable to:
overwrite the stored segment of data with a corrected segment of data in which the single error is corrected; and
calculate the ECC syndrome of the second type based on the corrected segment of data.

10. The system of claim 9, wherein the segment of data included in the response is the corrected segment of data.

11. A system comprising:
a memory controller;

multiple memories coupled to the memory controller; and
multiple controlling components coupled to the memory controller, wherein the memory controller is operable to:
calculate an error correction code (ECC) syndrome of a first type for a segment of data;
store the segment of data and the ECC syndrome of the first type in a first memory of the multiple memories;
receive a request from a controlling component of the multiple controlling components directed to the segment of data, the controlling component operable to implement an ECC syndrome of a second type;
transform the ECC syndrome of the first type for the segment of data to the ECC syndrome of the second type;
detect a number of errors, if any, present in the segment of data;
correct the error to generate a corrected segment of data based on the transform operation, when it is determined that one error is present in the segment of data; and
send a response to the controlling component.

12. The system of claim 11, wherein, to transform the ECC syndrome of the first type for the segment of data to the ECC syndrome of the second type, the memory controller is operable to recalculate the ECC syndrome of the first type based on the segment of data in the memory controller.

13. The system of claim 12, wherein, when the memory controller detects that more than one error are present in the segment of data, the response includes an interrupt that indicates that errors are present in the segment of data and that the errors are not correctable.

14. The system of claim 12, wherein the controlling component is operable to determine an action to take with respect to the errors present in the segment of data based on the response.

15. The system of claim 11, further comprising:
an ECC component operably coupled to the memory controller.

16. A system comprising:
a memory controller;
multiple memories, including a first memory and a second memory, coupled to the memory controller; and
multiple controlling components coupled to the memory controller, wherein the memory controller is operable to:
receive a transaction from a controlling component of the multiple controlling components, the transaction directed to the first memory and including an address;
calculate an error correction code (ECC) for a segment of data in the second memory;
determine that a non-correctable error is present in the segment of data in the second memory based on a comparison of the calculated ECC and a stored ECC for the segment of data; and
terminate the transaction in response to determining that a non-correctable error is present in the segment of data in the second memory.

17. The system of claim 16, wherein the memory controller is operable to terminate the transaction without accessing the first memory.

18. The system of claim 16, further comprising:
an ECC component operably coupled to the memory controller.

* * * * *